United States Patent [19]

Enquist

[11] Patent Number: 5,780,880

[45] Date of Patent: Jul. 14, 1998

[54] HIGH INJECTION BIPOLAR TRANSISTOR

[75] Inventor: Paul M. Enquist, Cary, N.C.

[73] Assignee: Research Triangle Institute, Research Triangle Park, N.C.

[21] Appl. No.: 651,396

[22] Filed: May 22, 1996

[51] Int. Cl.$^6$ .............. H01L 31/0328; H01L 31/0336; H01L 31/072; H01L 31/109

[52] U.S. Cl. .............. 257/197; 257/188; 257/189; 257/198

[58] Field of Search .................. 257/191, 197, 257/188, 189

[56] References Cited

U.S. PATENT DOCUMENTS 5,552,617  9/1996  Hill et al. ..................... 257/197

OTHER PUBLICATIONS

Performance Evaluation of Heterojunction Bipolar Transistors Designed for High Optical Gain, P. Enquist et al., Research Triangle Institute, Research Triangle Park, N.C., Abstract-10 pages.
Optical Intensity Modulator for Integrated Optics by use of a Heterojunction Bipolar Transistor Waveguide Structure, Yoshitaka Okada et al., Appl. Phys. Lett. 55(25), 18 Dec. 1989, pp. 2591-2593.
The Effect of Band-Tails on the Design of GaAs/AlGaAs Bipolar Transistor Carrier-Injected Optical Modulator/Switch, Yoshitaka Okada et al., IEEE Journal of Quantum Electronics, vol. 25, No. 4, Apr. 1989, pp. 713-719.

Primary Examiner—Sara W. Crane
Assistant Examiner—Douglas A. Wille
Attorney, Agent, or Firm—Oblon, Spivak, McClelland, Maier & Neustadt, P.C.

[57] ABSTRACT

An optoelectronic semiconductor device using stimulated emission and absorption to achieve the functions of detection, modulation, generation and/or amplification of light. In one embodiment, the device includes a waveguide heterojunction bipolar transistor (HBT) biased in the active mode where the minority carrier concentration in the base is designed with bandgap engineering to optimize optical gain in this region. This HBT configuration allows optical modulation at considerably higher frequencies and/or with improved efficiency compared to the prior art, and is particularly suited to the fabrication of direct or external modulated wideband fiber optic links.

17 Claims, 11 Drawing Sheets

HIGH INJECTION BIPOLAR TRANSISTOR

BACKGROUND OF THE INVENTION

1. Field of the Invention

The present invention relates to a semiconductor device for detecting, modulating, generating and/or amplifying light at very high frequencies with very high electrical to optical power conversion efficiency and a process for producing the same.

2. Discussion of the Background

The generation, modulation, detection, and/or amplification of light is typically done with semiconductor diodes. Generation and amplification is typically done with forward bias diodes using stimulated emission. Detection is typically done with reverse biased diodes using stimulated absorption in a depletion region. The detection response time is typically limited by the transit time of photogenerated holes and electrons. Modulation is typically done with reverse biased diodes using electroabsorptive or electro-optic effects or forward biased diodes. The maximum modulation rate using electroabsorptive effects is typically limited by the transit time of photogenerated holes and electrons to ~ 20 GHz. Although the maximum modulation rate for reverse biased diodes using electro-optic effects is larger, it requires higher operating voltages and considerably larger device sizes than forward biased diode schemes. The maximum small signal modulation rate for forward biased diodes is typically limited by relaxation oscillations to ~ 30 GHz.

The generation, modulation, detection and amplification of light is also typically done with transistors. This facilitates integration with electronic circuits. These transistors are typically unipolar, for example field-effect transistors (FETs), or bipolar, for example heterojunction bipolar transistors (HBTs). FETs are typically used for modulation and detection of light. HBTs can further be used for generation and amplification of light due to their bipolar nature. The detection response time of both transistors is typically limited by the transit and/or recombination of photogenerated holes and electrons.

The use of HBT devices for modulation, amplification and/or generation of light is typically done with the device biased in the saturation mode to obtain very high minority carrier concentrations in the base required for stimulated emission. However, the temporal response of these devices is limited by charge storage associated with this bias condition compared to transistors biased in the active mode.

HBT devices biased in the active mode with a thick base used for waveguiding have also been used for optical modulators using free carrier injection. However, these devices typically do not achieve high injected carrier densities or high optical gain and thus suffer from a severe tradeoff between modulation depth and relative output power. Furthermore, the thick base significantly limits the temporal response compared to conventional HBT devices.

The generation, amplification, modulation and/or detection of light is also typically done with device structures which are hybrid configurations of diodes and transistors. These devices typically combine diode and transistor functions resulting in a device with greater than three electrodes. These devices typically increase the monolithic functionality compared to a diode or transistor as opposed to improving the operational performance obtainable with separate devices.

SUMMARY OF THE INVENTION

It is therefore an object of the present invention to provide a novel method of generating, detecting, modulating and/or amplifying light with bipolar transistors designed for high optical gain.

A further object of the present invention is to provide a method for very high speed modulation and detection of light with bipolar transistors designed for high optical gain.

An additional object of the present invention is to avoid delays in the modulation and detection of light associated with the transit and/or recombination of photogenerated carriers.

A still further object is to achieve generation, amplification, detection and/or modulation of light with a HBT biased in the active mode where the minority carrier concentration in the base is optimized with bandgap engineering.

Another object of the present invention is to provide a method for the high speed modulation and detection of light at low RF drive.

A still further object of the present invention is to provide a three terminal device capable of efficient generation and amplification of light, high speed modulation and detection of light, and high speed transistor action.

Another object of the present invention is to provide for the integration of electrical and optical functions in a single device with improved performance.

A still further object of the present invention is to provide a means for making a high current, high speed coherent electrical interconnection to a very long device without incurring excessive parasitic loading.

These and other objects are obtained by a semiconductor device composed of a multilayer epitaxial wafer in which in a minority carrier layer, for example the base layer in a bipolar transistor, there is provided a region of lower bandgap energy to significantly increase the injected minority carrier concentration in this region and hence optical gain. A large enough bandgap difference between this region and the remainder of the minority carrier layer is desirable to confine optical transitions to the region to minimize parasitic absorption in remainder of the minority carrier layer. It is also desirable to restrict the thickness of the minority carrier layer to a thickness comparable to high performance electronic device structures to minimize the minority carrier transit time. It is further desirable to provide a depleted transit layer adjacent to the minority carrier layer. The transit layer can be, for example, a first collector layer in a bipolar transistor, with bandgap energy comparable to the minority carrier layer but significantly less than the emitter layer on the other side of the minority carrier layer and a second collector layer layers adjacent to the first collector layer. The emitter and second collector are of sufficient thickness to provide optical waveguide cladding regions to the minority carrier layer and first collector layer to obtain an optical waveguide with a confinement factor comparable to that obtained in high performance optical device structures.

A first embodiment of the device according to the invention is a heterojunction bipolar transistor (HBT) with a reduced bandgap region for about half the base region thickness near the emitter-base junction in the epitaxial structure. In a GaAs-based HBT with an AlGaAs emitter and GaAs base and collector, the reduced bandgap region may be formed with an InGaAs alloy with a nominal InAs alloy composition of, for example, 10 percent. Fabrication of laser, detector, modulator and/or optical amplifier devices from this epitaxial structure is comprised of a conventional metalization, mesa etching and/or ion implantation techniques to isolate and contact the emitter, base and collector. Devices according to the invention with relatively long emitter lengths (~ 100 μm) are used to improve optical interaction within the device in a waveguide configuration.

This may be achieved by fabricating devices significantly longer than this length followed by cleaving to form the desired cavity length of the device. The long device length requires the formation of interconnection to the device in a direction normal to the device length to minimize interconnect resistance and phase delay as opposed to conventional HBT fabrication which typically utilizes emitter and base interconnection parallel to the device length.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
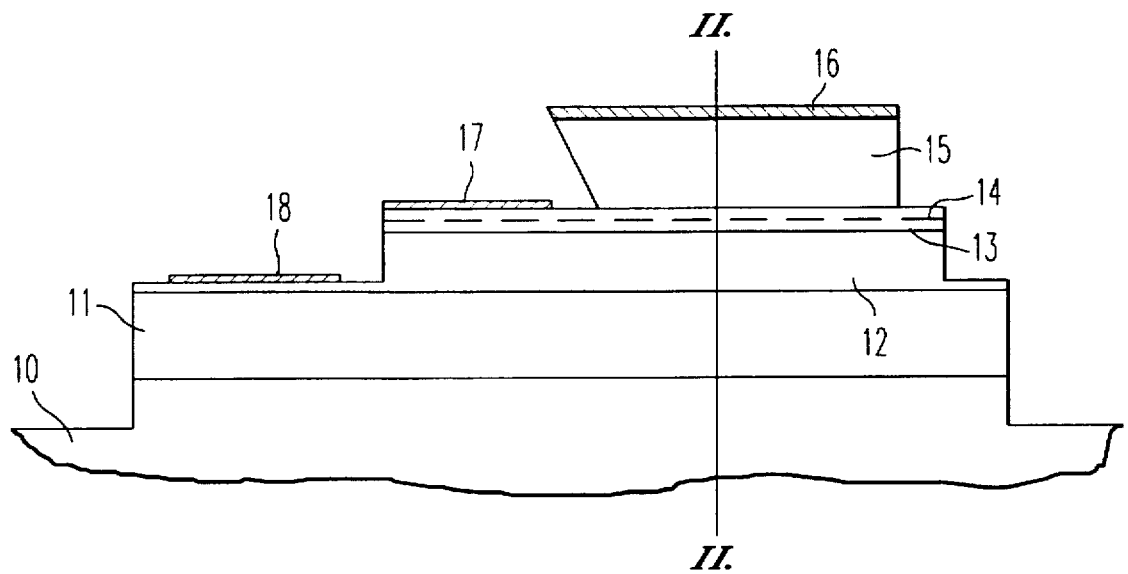
FIG. 1 is a sectional view showing a heterojunction bipolar transistor illustrating a first embodiment of the method according to the invention.

Referring now to the drawings, wherein like reference numerals designate identical or corresponding parts throughout the several views, and more particularly to FIG. 1 thereof, there is shown a sectional view illustrating a first embodiment of the device according to the invention. It should be pointed out that the drawings are schematic representations of the invention and are not meant to show actual or relative device dimensions, thicknesses, etc. The drawings are only meant to illustrate the invention to allow one of ordinary skill in the art to understand how to make and use the same. For example, the drawings typically show a frontside collector contact and a semi-insulating substrate, but it is understood that a typical device may employ a conductive substrate and a backside collector contact.

FIG. 1 shows wide bandgap emitter layer 15, reduced bandgap base layer 14, conventional narrow bandgap base layer 13, conventional narrow bandgap collector layer 12, preferably having an increased doping near the bottom of the layer, and wide bandgap (sub)collector layer 11 formed on top of a substrate 10. Layer 12 is a depleted transit layer except for the region of increased doping. Metal contacts 16, 17 and 18 are formed on the emitter, the reduced bandgap base, and the increased doping region of the conventional narrow bandgap collector layers, respectively. The base layer consists of two regions where the emitter is in contact with the region of reduced bandgap. The difference in bandgap between the two regions of the base layer must be sufficient to provide for a desired increase in minority carrier concentration in the reduced bandgap region. The higher minority carrier concentration in the reduced bandgap region improves device performance by increasing the change in optical gain (or loss) for a given change in emitter-base potential.

In one implementation of the device according to the invention, substrate 10 is a GaAs material, (sub)collector layer 11 is an AlGaAs layer of approximately 30 percent AlAs alloy composition and approximately 5000 Å in thickness n-doped to a concentration $>10_{18}$ cm$^{-3}$, conventional narrow bandgap collector layer 12 is a composite GaAs layer of approximately 2200 Å in thickness n-doped to a concentration $\sim 2\times10^{16}$ cm$^{-3}$ and GaAs layer of approximately 500 Å in thickness n-doped to a concentration $\sim 2\times10^{18}$ cm$^{-3}$, conventional narrow bandgap base layer 13 is a GaAs layer of approximately 400 Å in thickness p-doped to a concentration $\sim 3\times10^{19}$ cm$^{-3}$, reduced bandgap base layer 14 is an InGaAs layer of approximately 10 percent InAs alloy composition and approximately 400Å in thickness p-doped to a concentration $\sim 3\times10^{19}$ cm$^{-3}$, and wide bandgap emitter layer 15 is a composite layer comprised of an AlGaAs layer of approximately 30 percent AlAs alloy composition and approximately 5000 Å in thickness n-doped to a concentration $>10^{17}$ cm$^{-3}$ and a GaAs layer approximately 500 Å in thickness n-doped to a concentration of $>10^{18}$ $^{cm-3}$, although other thicknesses and materials are possible. Emitter and (sub)collector layers may further include a GaAs-AlGaAs graded region of approximately 500 Å in thickness n-doped to a concentration $>10^{18}$ cm$^3$ between GaAs and AlGaAs materials to reduce resistance.

In the device of FIG. 1 mesa etching can be performed to reveal subcutaneous layers prior to contact metalization for ease of fabrication. FIG. 1 also shows significant undercut of the emitter metalization to provide a spacing between base contact metalization 17 and emitter material 15 comparable to the wide bandgap emitter layer 15 thickness to reduce optical loss associated with overlap of the optical field and contact metalization. The conditions affecting the shape of the undercut include the emitter layer material and its orientation, and the etching parameters. These conditions are selected to give the desired amount of undercut (and desired amount of base contact to emitter material separation). The edge of the emitter layer 15 opposite the base contact is shown as vertical. However, this edge can also be undercut, or have an overcut, depending upon the conditions selected (i.e., material and orientation of the material, and etching parameters).

Figure 2A:
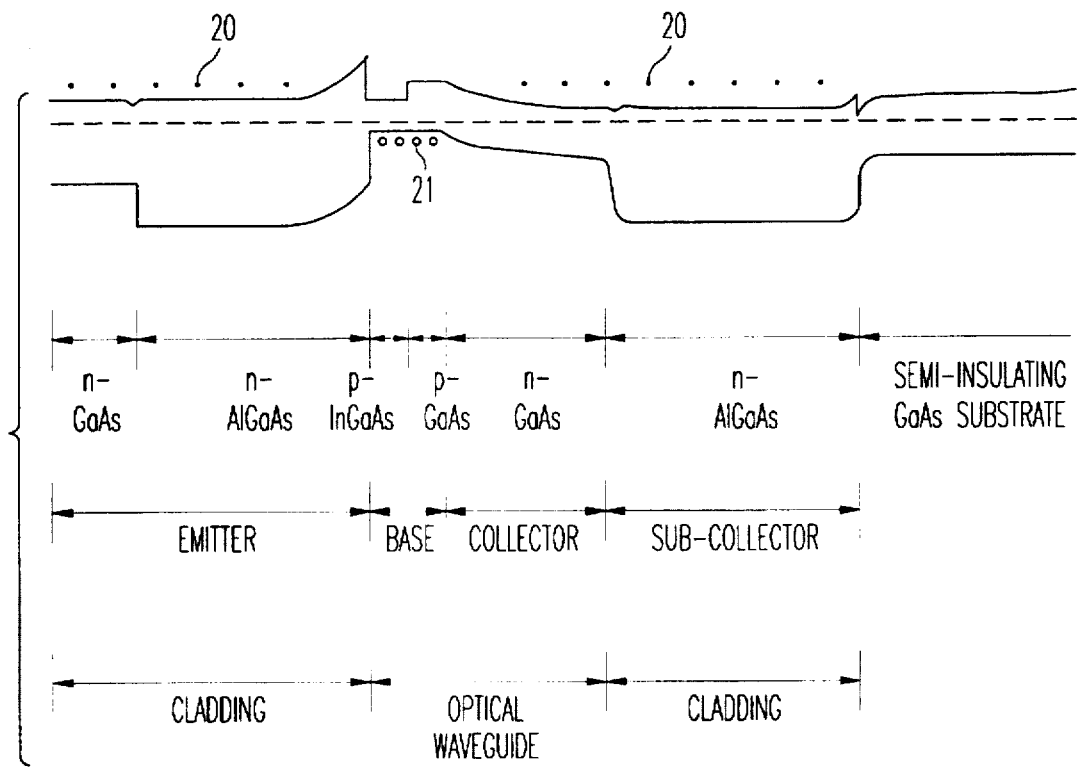
FIGS. 2A and 2B are views showing energy bands corresponding to various different states of the transistor, i.e., thermal equilibrium and active, respectively.

FIG. 2A provides a schematic thermal equilibrium energy band diagram along section II–II' in FIG. 1, showing free electron 20 concentrations in the emitter layer 15 and (sub)collector layer 11 and a free hole 21 concentration in the reduced bandgap base layer 14 and conventional narrow bandgap base layer 13. FIG. 2A also illustrates typical materials used for the different layers, regions typically referred to as emitter, base, collector, and (sub)collector in typical heterojunction bipolar transistor (HBT) nomenclature and regions typically referred to as cladding and optical waveguide in typical laser nomenclature.

Figure 2B:
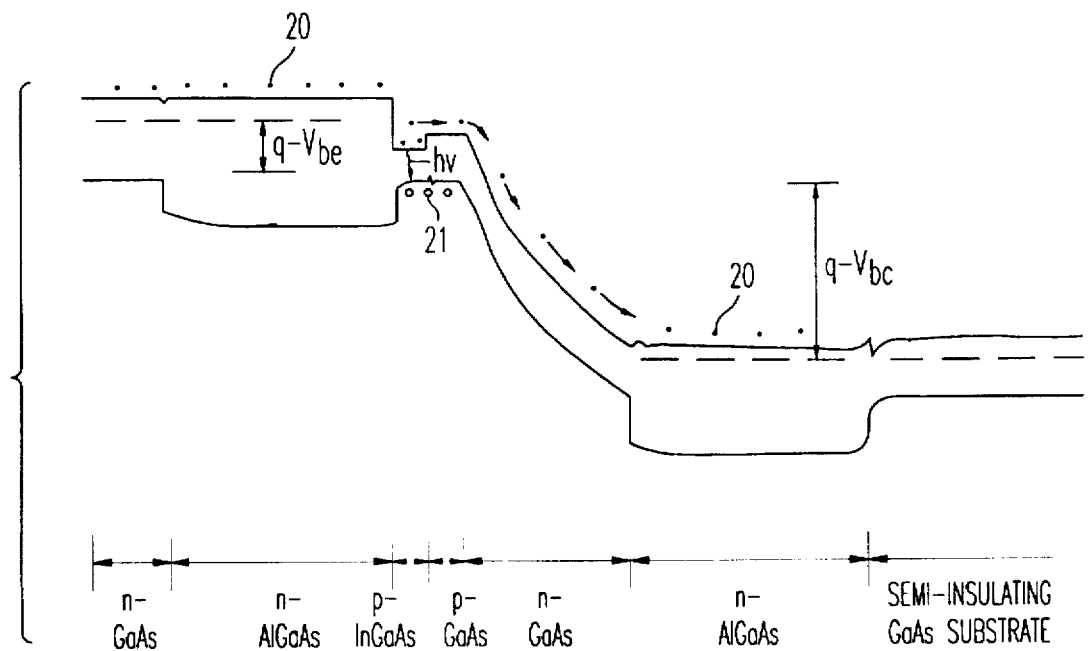

FIG. 2B provides a schematic energy band diagram along section II–II' in FIG. 1 with active bias, i.e., a forward bias potential ($qV_{be}$) on the emitter-base junction and a reverse bias potential ($qV_{bc}$) on the base-collector junction. Shown are free electron 20 concentrations in the emitter and (sub) collector layers and a free hole 21 concentration in the reduced bandgap base and conventional narrow bandgap base layers and the direction of electron flow from emitter to collector under this bias configuration. Also indicated in FIG. 2B is a significant accumulation of electrons in the reduced bandgap base compared to the conventional narrow bandgap base and an associated stimulated emission of light (hv) from this region due to either recombination originating from within the reduced bandgap base or light incident on the reduced bandgap base layer from outside the device. This rate of stimulated emission is accompanied by a rate of stimulated absorption, the net rate being determined by separation of the electron and hole quasi-fermi levels in the reduced bandgap base. FIG. 2B also illustrates typical materials used for the different layers.

Figure 3A:
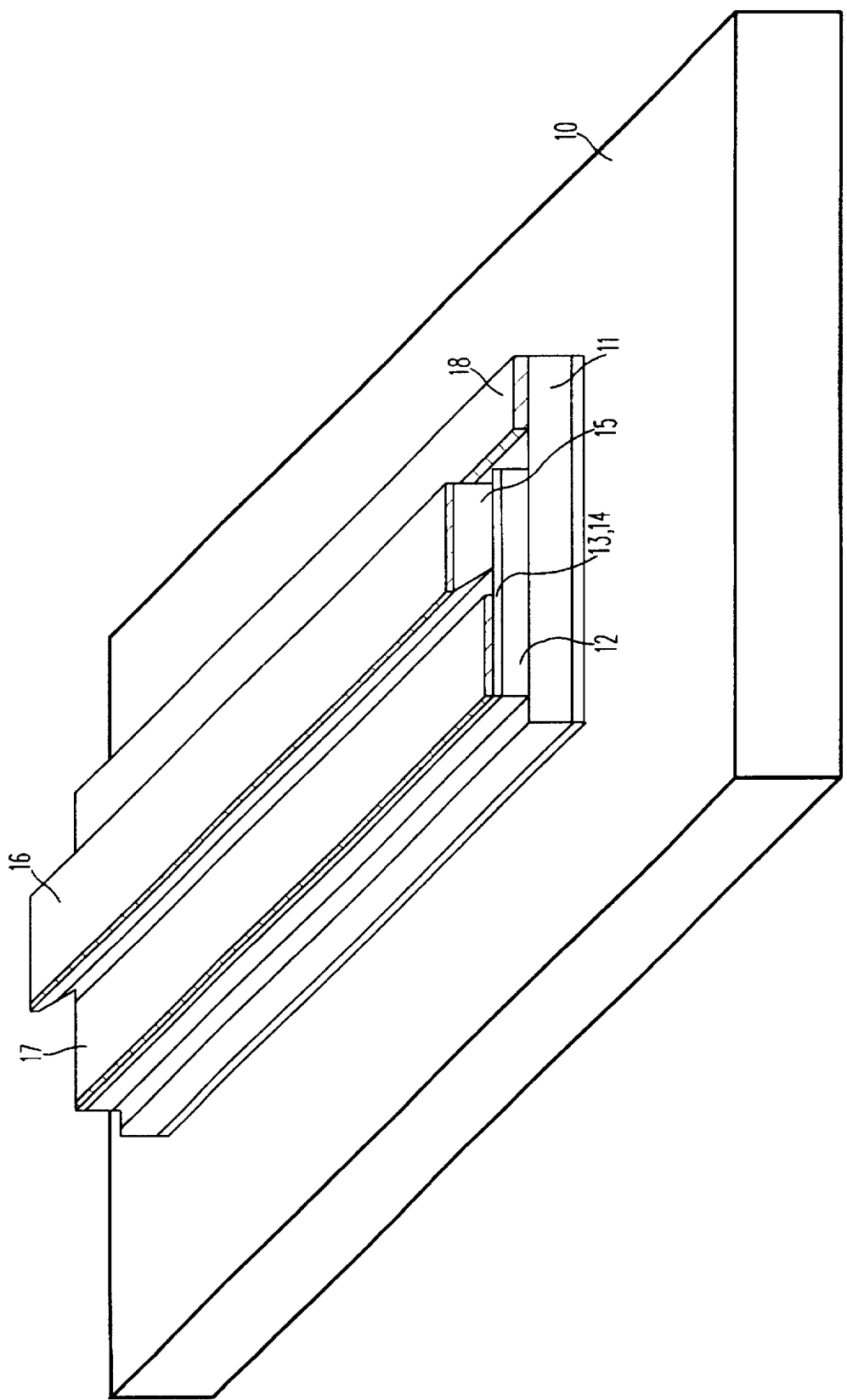
FIGS. 3A–3C are perspective views showing a device at different stages of fabrication achieving minimum parasitic device interconnection according to a first embodiment of the invention which can be used as a laser, modulator, amplifier and/or detector.

Referring now to FIG. 3A, a perspective view of the device according to the invention is provided which is similar to the cross sectional view provided in FIG. 1 except for an alternate electrode configuration whereby the respective collector and base contacts 17 and 18 are provided on opposite sides of the emitter contact 16 instead of the same side. These structures are realized with conventional HBT fabrication techniques, an example of which follows.

Figure 4A:
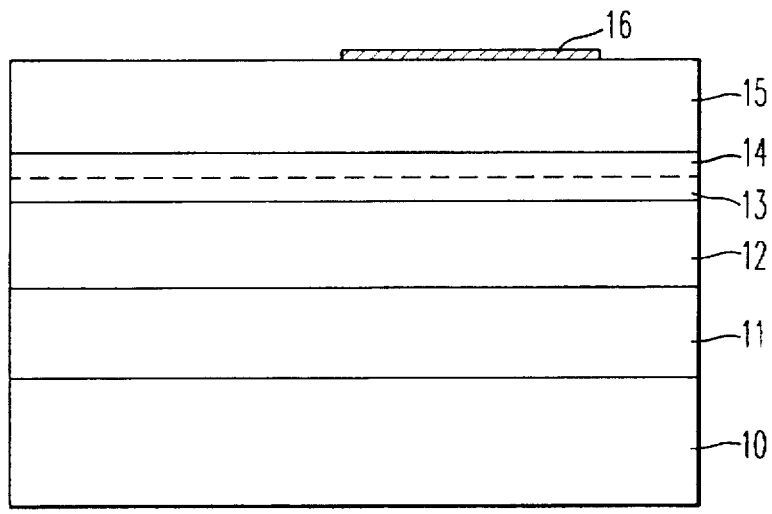
FIGS. 4A–4C are sectional views illustrating a first embodiment of the method according to the invention.
Figure 4B:
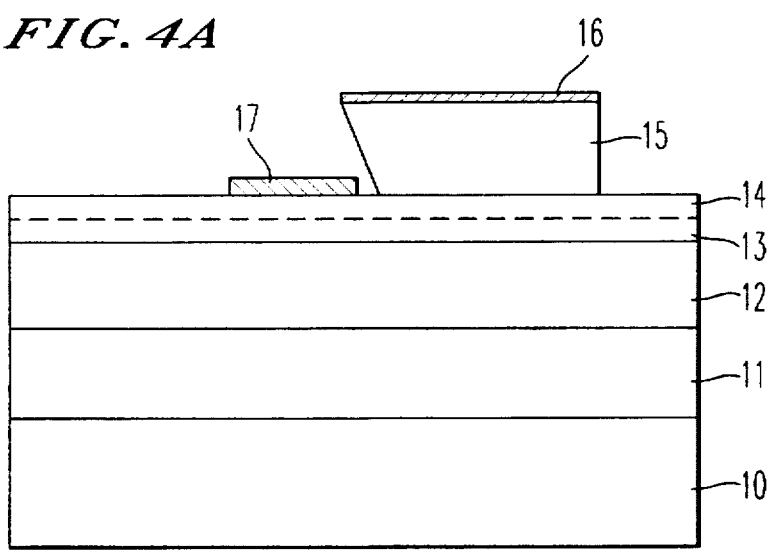
Figure 4C:
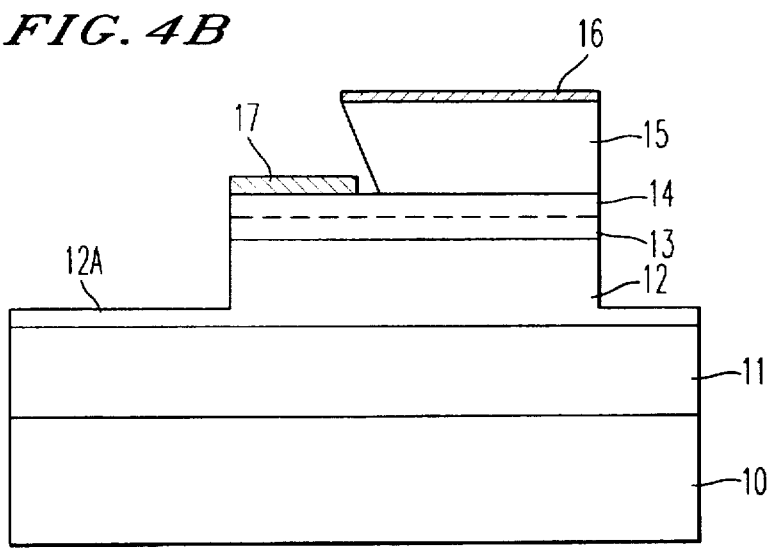

FIGS. 4A–4C illustrate a method for making the device shown in FIG. 1. In FIG. 4A the layers 11–15 are formed on the substrate 10 using convention film formation techniques. An emitter contact metal is deposited on the emitter layer 15 to form contact 16, preferably by lift-off. A typically width of the contact 16 is 2–10microns. Etching of emitter layer 15 to the reduced bandgap base layer 14 using the emitter contact 16 as a mask follows (FIG. 4B). This etching may be carried out using a combination of known wet and/or dry selective and/or nonselective etches. However, dry etching, using for example Cl-based etch chemistry, is preferred for achieving smooth, vertical walls at the ends of the device to facilitate formation of a resonant cavity if desired, for example, for laser fabrication. As described above, the material, its orientation and the etching parameters are selected to produce a desired undercut.

A base contact metal is then deposited on the reduced bandgap base layer 14 to a nominal width of 2microns. This deposition may be self-aligned to the emitter 15 if sufficient undercut of the emitter contact 16 is achieved prior to base contact deposition, as is shown in FIG. 4B. Base layers 13 and 14 and conventional narrow bandgap collector layer 12 are then etched (FIG. 4C) to the region of higher doping concentration (12A of layer 12). The etching may be carried out using a combination of known wet and/or dry etches. However, dry etching, using for example Cl-based etch chemistry, is preferred for achieving smooth, vertical walls at the ends of the device to facilitate formation of a resonant cavity.

A collector contact 18 is then deposited on the region of conventional narrow bandgap collector layer 12 with higher doping concentration (or on layer 12A). The remaining conventional narrow bandgap collector layer 12A and (sub) collector layer 11 are etched to the semi-insulating substrate resulting in device isolation and the structure shown in FIG. 3A. The etching could continue and a portion of the substrate is removed, as shown in FIG. 1. This etching may be carried out using a combination of known wet and/or dry etches. However, dry etching, using for example Cl-based etch chemistry, is preferred for achieving smooth, vertical walls at the ends of the device to facilitate formation of a resonant cavity.

Figure 3B:
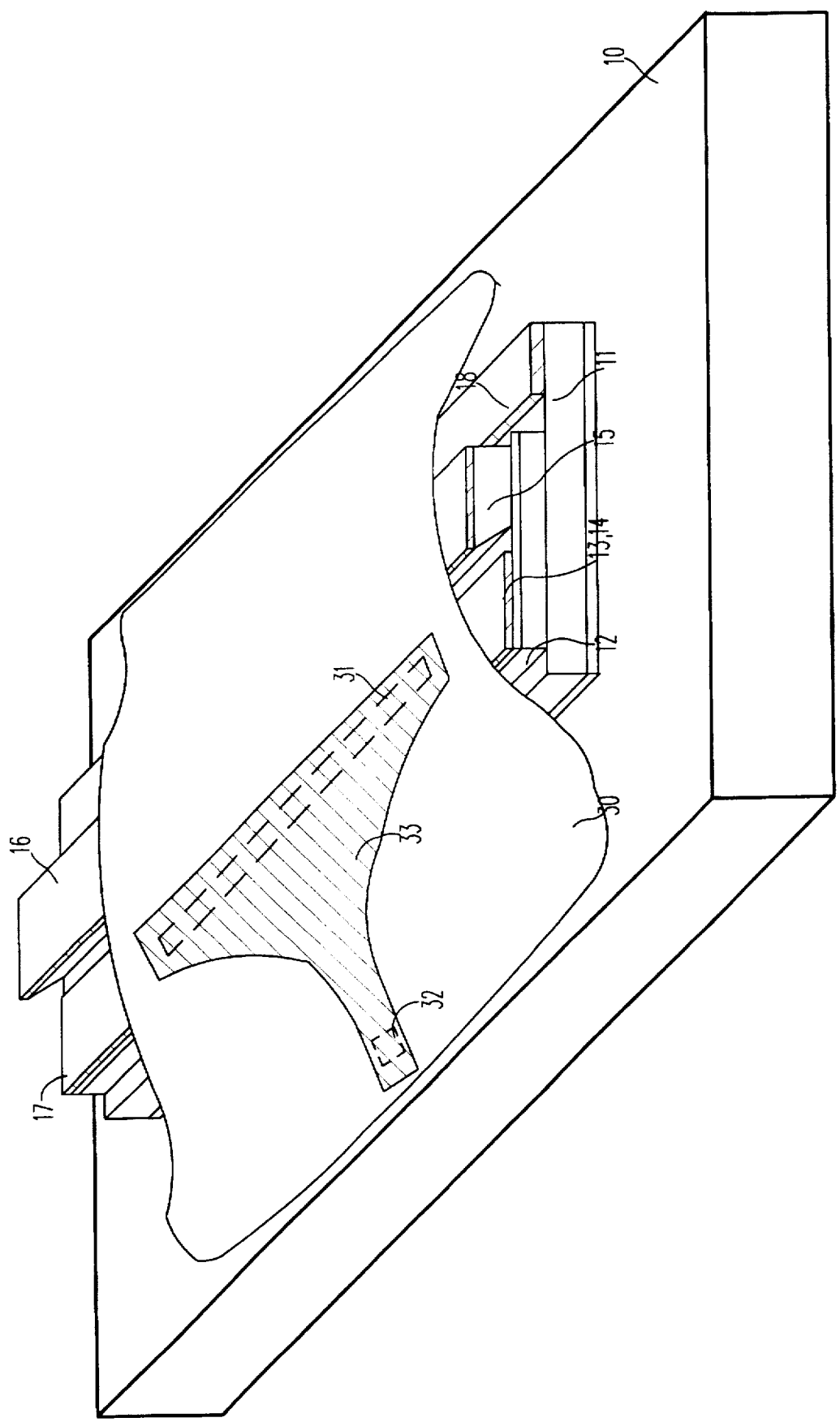
Figure 3C:
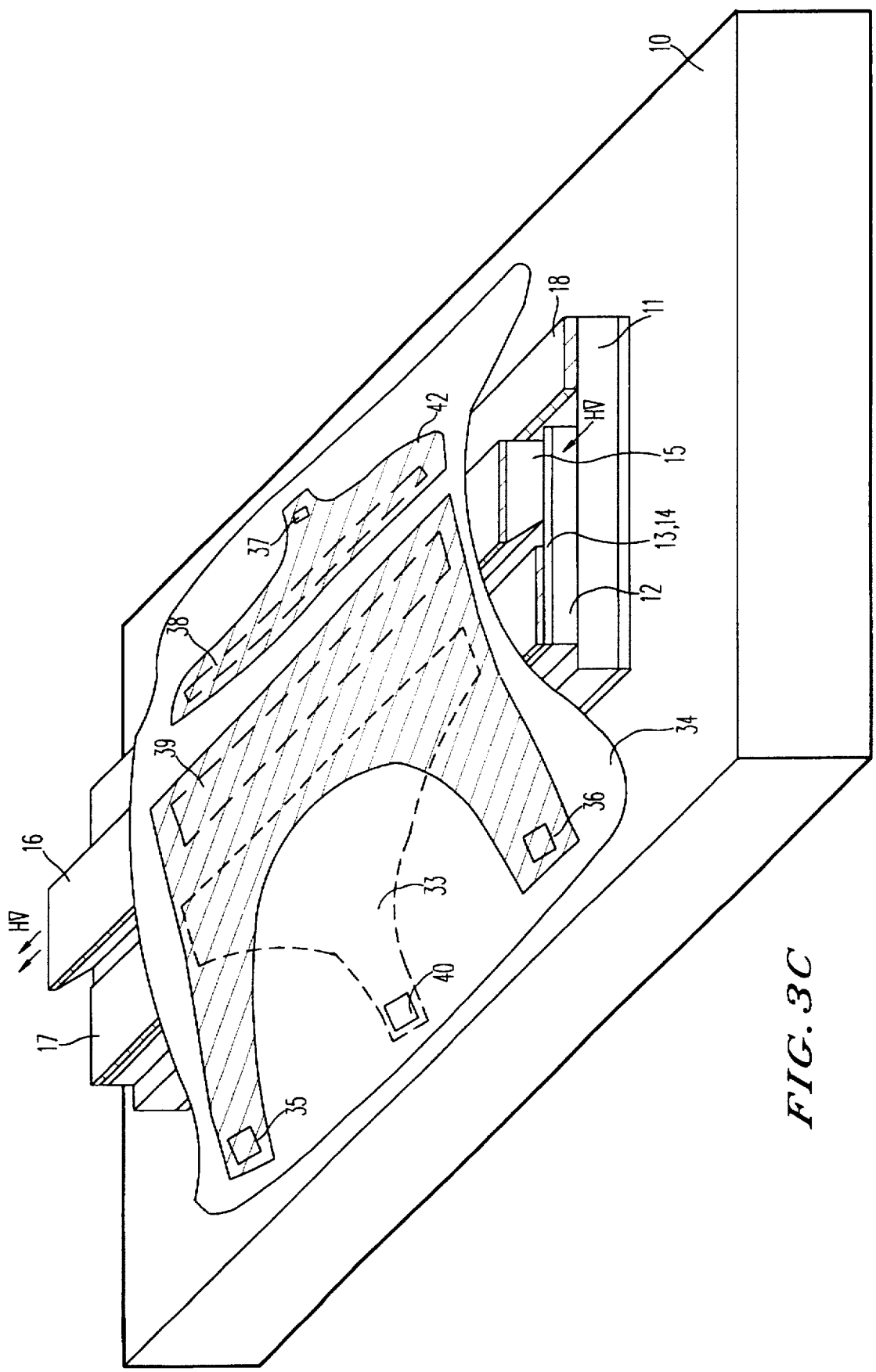
Figure 5A:
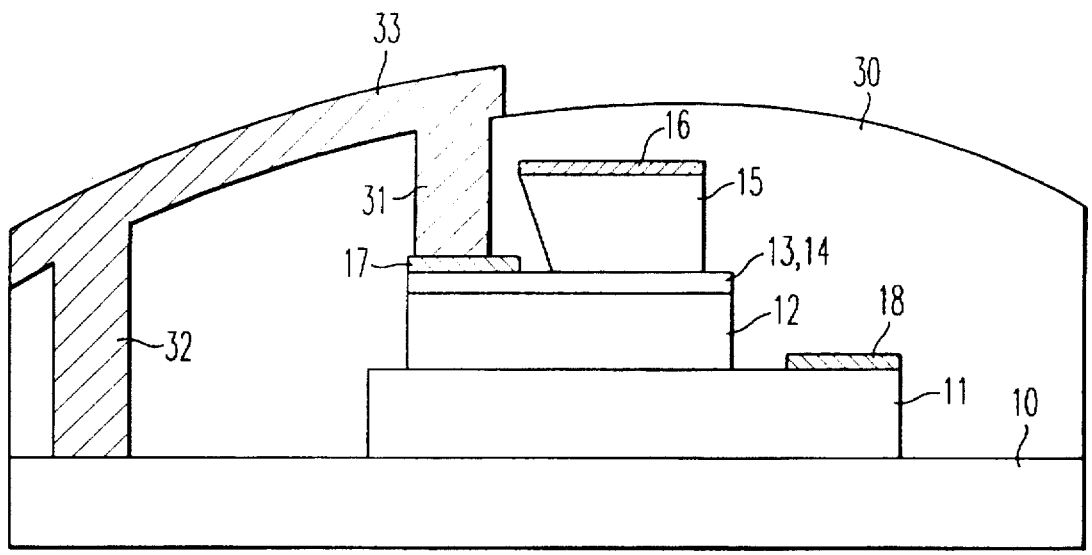
FIGS. 5A and 5B are sectional views illustrating a modification of the first embodiment of the method according to the invention.
Figure 5B:
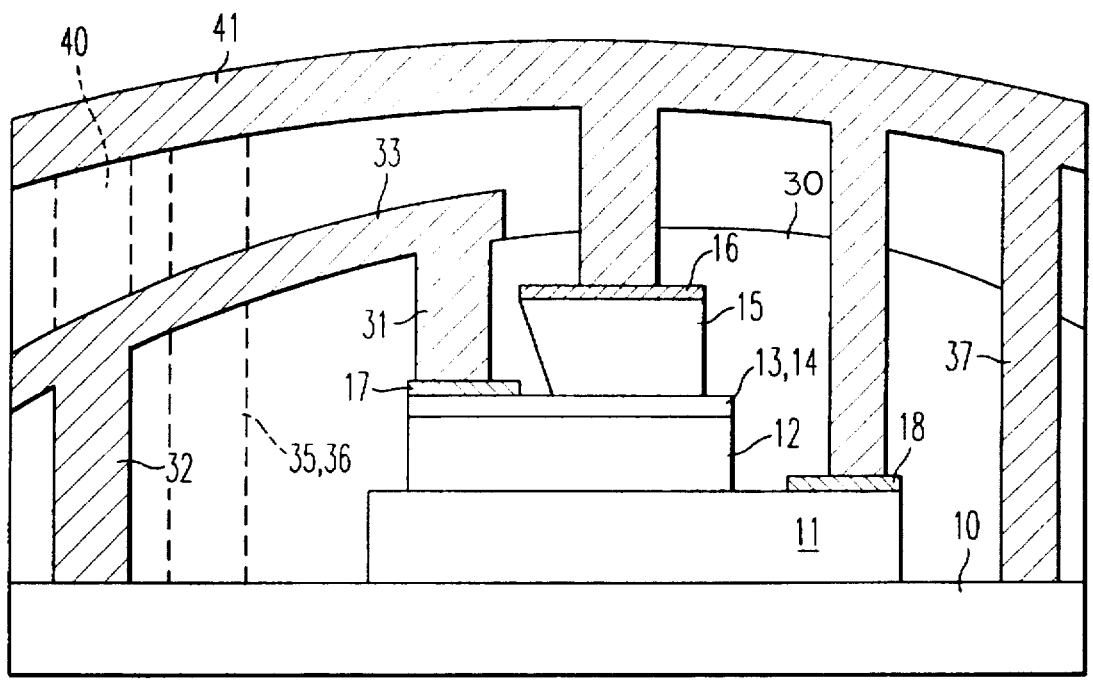

FIGS. 3B and 3C show perspective views of the device in FIG. 3A with subsequent processing to realize interconnection to a long device with minimum parasitics. The process for making the devices shown in FIGS. 3B and 3C is shown in FIGS. 5A–5B. After the structure in FIG. 3A is realized, a planarizing dielectric material 30 is deposited over the structure. A polyimide or probimide may be used for the planarizing dielectric film. FIGS. 3B, 3C, 5A and 5B show the planarizing films to have a curvature but they may also have a relative flat surface.

Vias 31 and 32 to the base contact 17 and substrate 10, respectively, are etched into material 30 (FIG. 5A). Base interconnect metal 33 is then deposited interconnecting base contact 17 with substrate 10 resulting in the perspective view given in FIG. 3B. A planarizing dielectric material 34 is then again deposited over the structure followed by etching of vias 39 and 38 to the emitter contact 16 and collector contact 18, respectively, and vias 35, 36 and 37 to substrate 10. A via 40 is also etched to expose interconnection 33. Emitter and collector interconnect metal 41 and 42 are then deposited, as shown in FIG. 5B, interconnecting emitter contact 16 and substrate 10 (and collector contact 18 and substrate 10) resulting in the perspective view given in FIG. 3C. These interconnections run nominally the entire length of the device and are RF fed normal to the device length ensuring phase coherence along the device length and avoiding potential drop along the length of the device compared to conventional HBT interconnection schemes which RF feed the device from the end(s).

Figure 6:
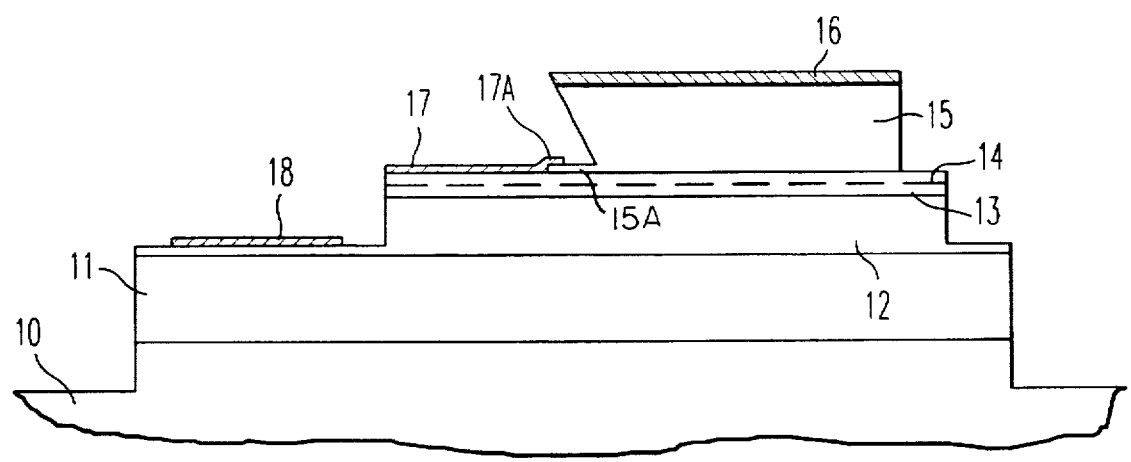
FIG. 6 is a sectional view showing a second embodiment of the invention.
Figure 7A:
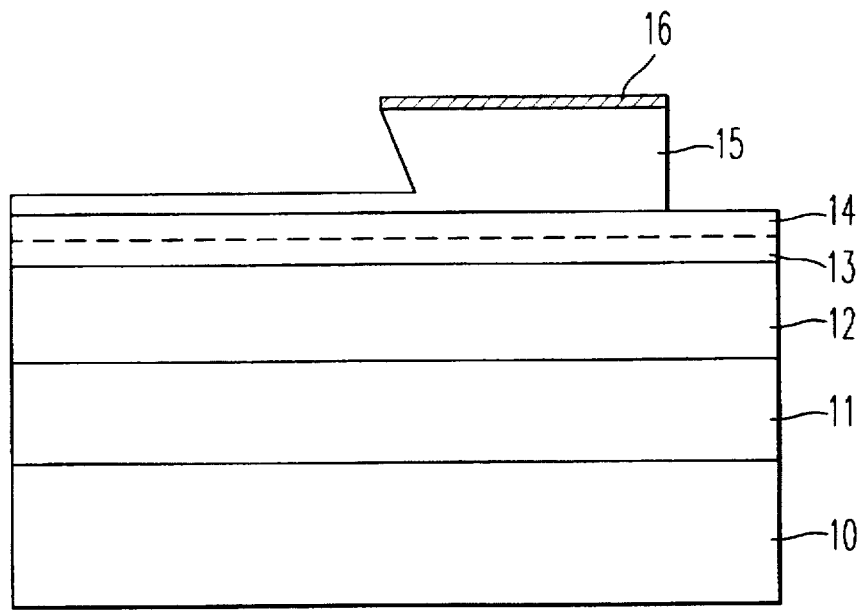
FIGS. 7A and 7B are sectional views illustrating a second embodiment of the method according to the invention.
Figure 7B:
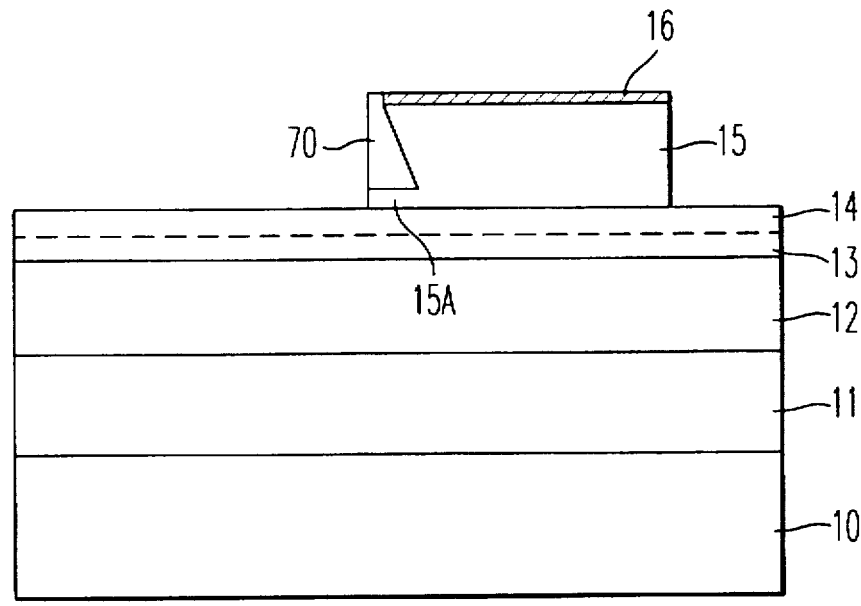

A second embodiment of the device and method according to the invention will be described in connection with FIGS. 6 and 7. This sectional view is similar to that provided in FIG. 1 with the exception of how the etching of the emitter layer 15 prior to base metalization is performed. In this embodiment, after deposition of emitter metal 16 (see FIG. 4A), emitter 15 is etched to within a determined thickness of the reduced bandgap base layer 14 which is surface depleted and will pass negligible current when the emitter-base junction is biased, as shown in FIG. 7A. This thickness depends upon the emitter doping density but is typically 200 Å–400 Å. A sidewall 70 is then formed on the emitter by, for example, deposition of ~2000 Å of silicon nitride and reactive ion etching of the silicon nitride (FIG. 7B). Etching to the reduced bandgap base layer 14 is then completed followed by removing the nitride to leave emitter ledge 15A followed by self-aligned base contact deposition to form base contact 17A that overlaps ledge 15A. The processing is then continued as in the first embodiment through device isolation resulting in a structure schematically indicated in FIG. 6.

Figure 8:
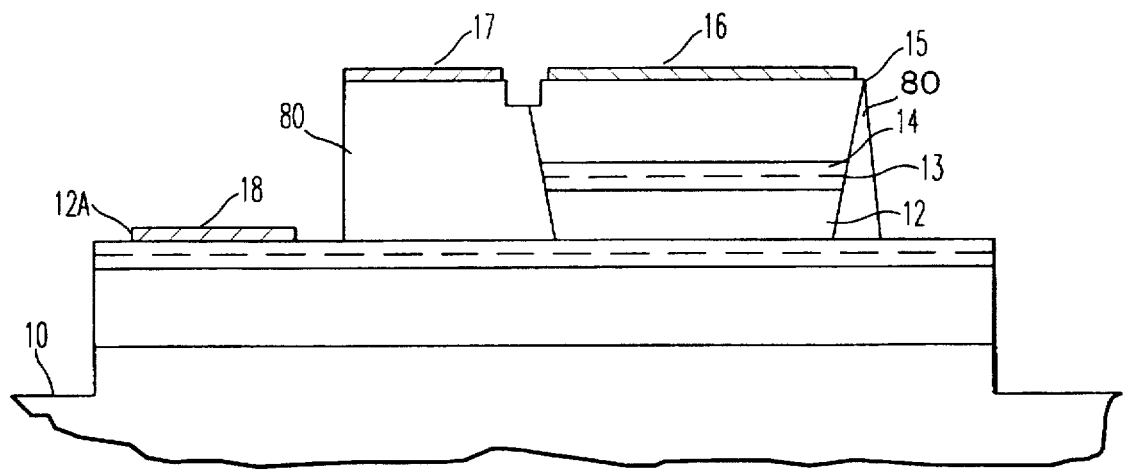
FIG. 8 is a sectional view showing a third embodiment of the device according to the invention.

A third embodiment of the device and method according to the invention will be described in connection with FIGS. 8 and 9. The device of FIG. 8 includes a reduced refractive index base region 80. Region 80 consists of a semiconductor material with refractive index substantially lower than that in the base and collector layers, i.e., typically larger bandgap, that is grown, for example by epitaxial regrowth, resulting in a buried heterostructure. The upper 500–1000 Å of layer 80 may be of reduced bandgap to improve contact resistance to this layer. An example of material 80 is AlGaAs with 30–50 percent AlAs alloy composition p-doped to ~$10^{18}$/cm$^3$ with upper 500–1000 Å GaAs p-doped to >$10^{19 8}$/cm$^3$. Layer 80 has an AlAs alloy composition sufficient to provide improved waveguiding and ensure that the turn-on of the emitter-base junction formed between layers 15 and 80 is sufficiently greater than that formed between layers 15 and 14 to minimize current flow between layers 15 and 80.

Figure 9A:
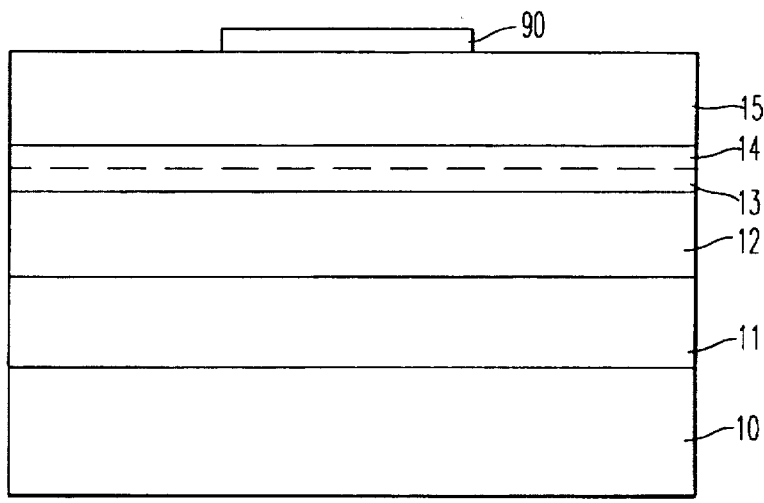
FIGS. 9A–9C are sectional views illustrating a third embodiment of the method according to the invention.
Figure 9B:
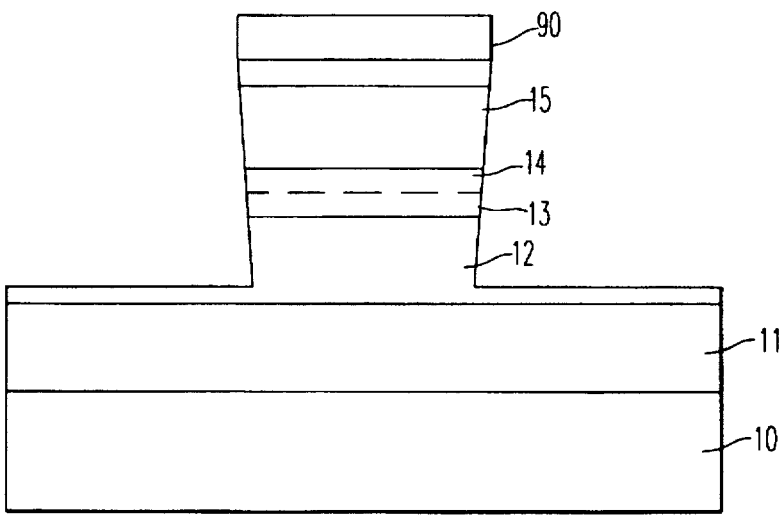
Figure 9C:
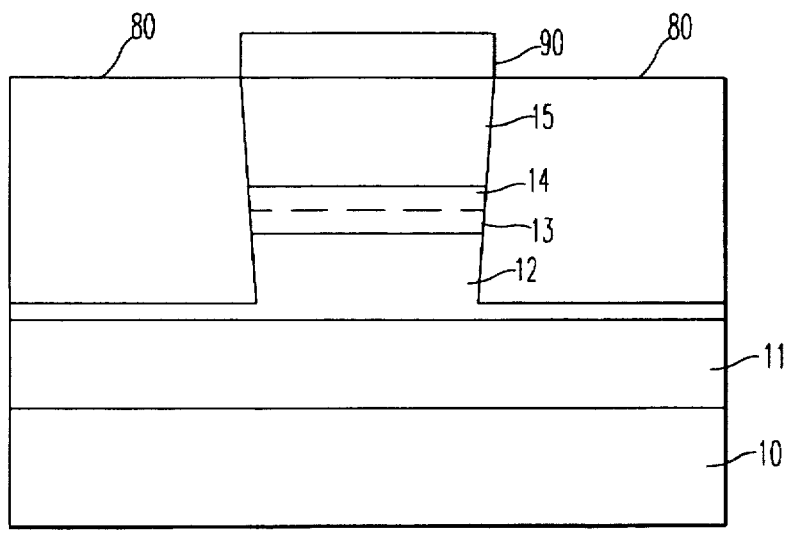

The method of manufacturing the third embodiment will be described referring to FIGS. 9A–9C. First, a material suitable for use as a mask for etching and epitaxially regrowth, such as silicon nitride is deposited. The nitride is etched to leave mask 90. The third embodiment of the method differs from the first embodiment of the method in that prior to emitter contact deposition, the emitter area is defined with the silicon nitride, and then etched into the conventional narrow bandgap collector layer. A wet etch is preferably used to achieve undercut of the silicon nitride and a semiconductor surface with minimal damage. Other configurations of the resulting mesa are possible.

After etching, a p-doped reduced refractive index base layer 80 is grown, preferably by epitaxial growth and preferably to planarize the structure. The upper 500–1000 Å of this region may be of reduced bandgap which typically has an increased refractive index to reduce contact resistance to this layer. The nitride mask 90 protects the upper surface of the emitter layer 15 during base layer 80 growth.

The nitride film 90 is then removed. Film 80 is etched to the conventional narrow bandgap collector layer 12 of higher doping concentration to provide region 12A, as shown in FIG. 8. The emitter, base, and collector contact metal deposition is then performed followed by additional etching steps to isolate the (sub)collector and eliminate the parasitic emitter-base junction between layer 15 and the upper 500–1000 Å of layer 80 resulting in a structure of FIG. 8. The collector contact 18 is preferably formed on layer 12 on the region of increased doping.

The collector contact 18 can also be formed on regrown region 80 if this regrowth includes approximately 1000 Å of heavily n-doped conventional narrow bandgap collector layer underneath the p-doped base layer. In this case, the etching of layer 80 is stopped to leave a thin portion of layer 80 less than approximately 1000 Å in thickness over 12A, contact 18" is formed on this thin portion, and region 12A need not be a region of increased doping. The base and emitter contacts 17 and 16 are then formed on layers 80 and 15, respectively (see FIG. 8).

This embodiment has the advantage of improved index guide for stable transverse mode and reduced loss by further distancing base metal from the optical waveguide.

Figure 10:
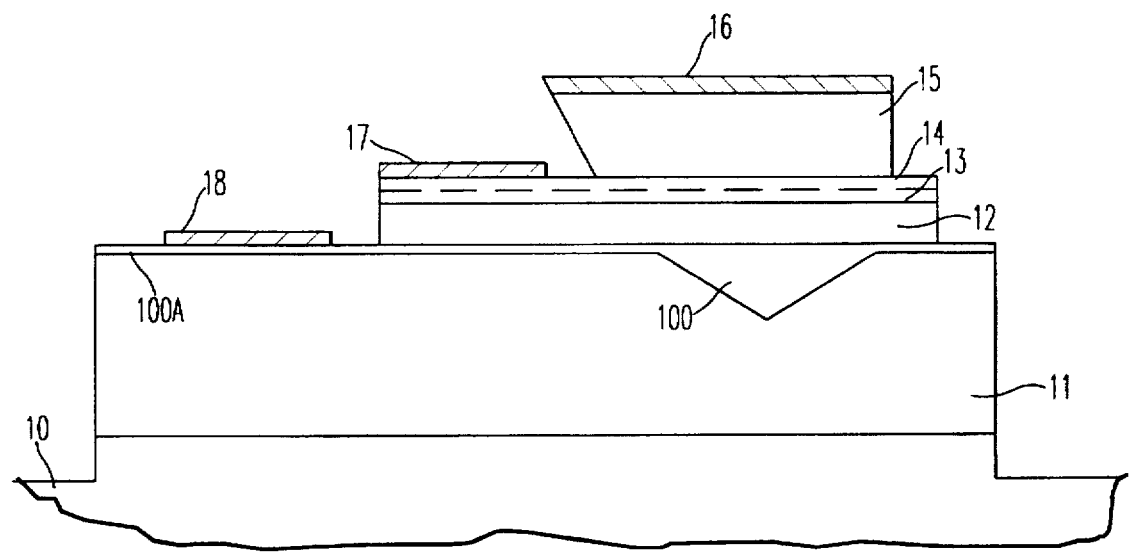
FIG. 10 is a sectional view showing a fourth embodiment of the device according to the invention.

A fourth embodiment of the device according to the invention is shown in FIG. 10. This embodiment is similar to the first embodiment with the addition of region 100. Region 100 is a regrown subcollector having an index of refraction similar to that of layer 12 or 13. Preferably this regrown subcollector is the same material as layer 12 but n-doped to a higher concentration (>$5\times10^{17}$ cm$^{-3}$) to minimize depletion. Furthermore, the V-groove region is approximately 0.1 to 1.0 µm deep and the thickness of region 100 on which the collector contact is formed, layer 100A, is approximately 1000 Å thick and n-doped to a concentration >$10^{18}$ cm$^{-3}$. The addition of layer 100 in this embodiment improves device performance by improving optical confinement by increasing the effective thickness of the optical waveguide core.

Figure 11A:
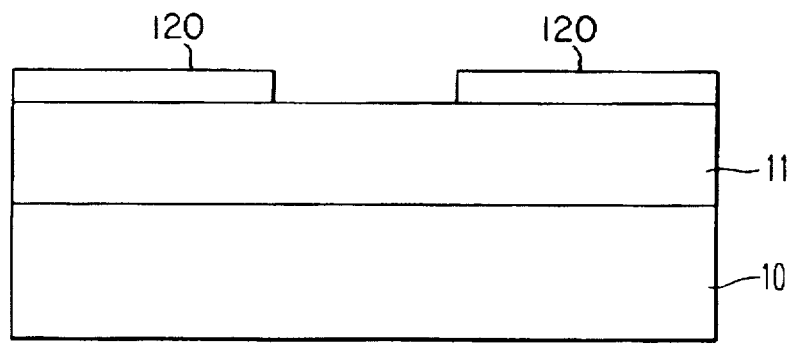
FIGS. 11A and 11B are sectional views illustrating a fourth embodiment of the method according to the invention.
Figure 11B:
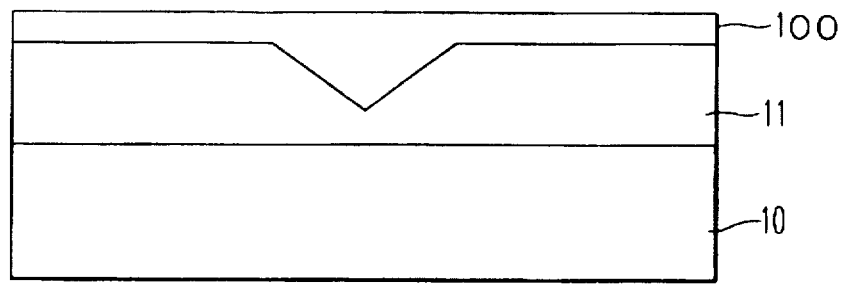

The fabrication of the fourth embodiment is shown in FIGS. 11A and 11B. Layer 11 is formed on substrate 10 and masked with material 120, as shown in FIG. 11A. Layer 11 is etched followed by growth of layer 100, preferably by epitaxial regrowth and preferably planarized. The etched shape is shown as a notch, but other etch profiles are possible. In epitaxial regrowth the higher growth rates along the etched surfaces helps produce a planar surface. The growth of layer 100 is continued until a desired thickness is obtained (FIG. 11B). The desired thickness in the final structure can be achieved by epitaxial growth alone or by epitaxial growth followed by etching of layer 100. Layers 12–15 are then formed on layer 100 and the fabrication of the device is completed similar to that shown in FIGS. 4A–4C, with the exception that layer 12 is etched through to layer 100, collector contact 18 is formed on portion 10A, and layer 12 does not contain a heavily doped region.

Figure 12:
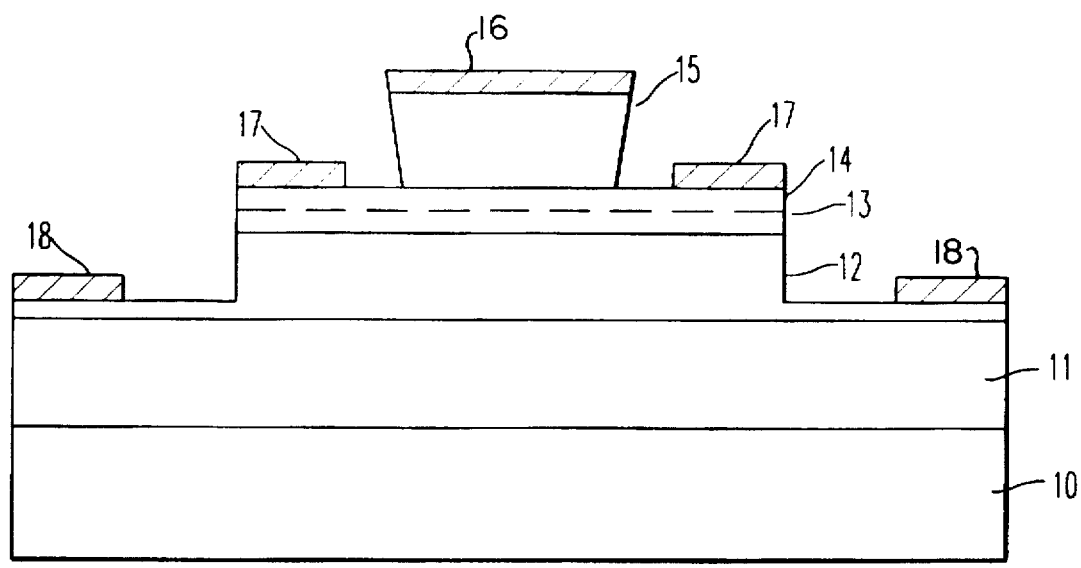
FIG. 12 is a sectional view showing a modification of the embodiments of the device according to the invention.

As mentioned above, the contacts 17 and 18 can be on the same or opposite sides of emitter 15. Dual base contacts 17 and dual collector contacts 18 are also possible, as shown in FIG. 12. In FIG. 12 the etching of layer 15 can be modified to give an undercut on both sides of the emitter, to provide dual self-aligned base contacts. While FIG. 12 is a modification of the first embodiment, the dual base and collector contact arrangement is applicable to each of the device embodiments.

The devices according to the invention described in the above embodiments can be used as lasers, modulators, optical detectors and amplifiers. Typical high speed lasers are limited by relaxation oscillations which result from coupling of electron-hole pairs with the optical field. The subject invention avoids this limitation by decoupling the electron-hole pairs from the optical field by the base transit time which removes electrons from the active region quicker than in a typical laser. Typical high speed modulators use either the linear electro-optic effect or the electroabsorption effect which require a relatively high RF drive voltage (~10 V). The subject invention allows speeds comparable or greater than typical modulators to be achieved at much lower RF drive voltages (~100 mV), resulting in a much greater insertion gain.

Typical HBT photodetectors rely on absorption in the base and collector. Absorption in the depleted n-doped collector results in generation of electron-hole pairs which results in an additional delay associated with drift of holes to the base. The subject invention restricts absorption in the base region avoiding this delay and optimizing high speed performance.

The subject invention further allows more than one of the above functions to be achieved with a single epitaxial device structure. This facilitates the integration of lasers, modulators, optical detectors and amplifiers in optoelectronic integrated circuits.

In the above described embodiments, heterojunctions utilizing AlGaAs, InGaAs, and GaAs were employed, but heterojunctions of other types, such as InP/InGaAs, AlGaN/GaN, etc., can be effectively employed as well. Furthermore, pnp structures can be employed. In addition, other electrode configurations including the use of one emitter and two base contacts, backside (substrate) collector contact, etc., may be employed. Furthermore, the resonant cavity, if desired, may be formed by a grating or other means besides a dry etch which provides smooth, vertical walls.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What is claimed as new and desired to be secured by Letters Patent of the United States is:

1. A bipolar transistor, comprising:
   a collector layer;
   an emitter layer; and
   a base layer having a region of reduced bandgap energy wherein said region having a reduced bandgap energy is disposed closer to said emitter layer than to said collector layer.

2. A transistor as recited in claim 1, comprising:
   said emitter layer being disposed on said region of reduced bandgap energy.

3. A transistor as recited in claim 1, wherein a thickness of said region of reduced bandgap energy is approximately one half a thickness of said base layer.

4. A transistor as recited in claim 1, wherein:
   said collector layer comprises a first collector layer of AlGaAs, a second collector layer of AlGaAs with AlAs alloy composition graded to zero, and a third collector layer of GaAs;
   said base layer comprises GaAs;
   said region of reduced bandgap energy comprises InGaAs; and
   said emitter layer comprises a first emitter layer of AlGaAs, a second emitter layer of AlGaAs with AlAs alloy composition graded to zero, and a third emitter layer of GaAs.

5. A transistor as recited in claim 4, wherein:
   said first collector layer comprises AlGaAs of approximately 30 percent AlAs alloy composition;
   said second collector layer comprises AlGaAs with AlAs alloy composition graded from approximately 30 percent to zero percent;
   said third collector layer comprises a composite GaAs layer;
   said region of reduced bandgap energy comprises InGaAs of approximately 10 percent AlAs alloy composition;
   said first emitter layer comprises AlGaAs of approximately 30 percent AlAs alloy composition;
   said second emitter layer comprises AlGaAs with AlAs alloy composition graded from approximately 30 percent to zero percent; and
   said third emitter layer comprises a composite GaAs layer.

6. A transistor as recited in claim 1, wherein said collector layer comprises:
   a first layer having a wide bandgap disposed on said substrate;
   a second layer having a graded bandgap from said wide bandgap to a narrow bandgap; and
   a third layer having a said narrow bandgap layer disposed on said second layer.

7. A transistor as recited in claim 6, comprising:
   said third layer having a thin portion; and
   a collector contact formed on said thin portion.

8. A transistor as recited in claim 1, comprising:
   a collector contact;
   a base contact; and
   an emitter contact,
   wherein said emitter layer comprises a ledge portion disposed on said region of reduced bandgap energy, and said base contact is disposed on said ledge portion and said region of reduced bandgap energy.

9. A transistor as recited in claim 1, said transistor further comprising:
   an insulative film disposed over said transistor;
   a via formed in said insulative film over at least one of said base, collector and emitter layers; and
   a contact lead to at least one said base, collector and emitter layers formed on said insulative film in contact with at least one of said base collector and emitter layers through said via, said contact having a length approximately the same as a length of said transistor.

10. A transistor as recited in claim 1, comprising:
    dual base contacts disposed on opposite sides of said emitter layer; and
    dual collector contacts disposed on said opposite sides of said emitter layer.

11. A transistor as recited in claim 1, wherein said base layer further comprises:
    a regrown reduced refractive index material disposed on said collector layer and in contact with said base layer and said emitter layer.

12. A transistor as recited in claim 11, comprising:
    a contact formed to each of said base, collector and emitter layers, wherein contact to said base layer is formed on said regrown material.

13. A transistor as recited in claim 11, comprising:
    a mesa structure comprising said emitter layer and said first and second base layers, wherein said regrown material is disposed on sides of said mesa structure and has an upper surface substantially planar with an upper surface of said mesa structure.

14. A transistor as recited in claim 1, wherein said collector layer comprises:
    a layer of first collector material disposed on said substrate;
    a groove formed in said layer of first collector material disposed beneath said base and emitter layers;
    a regrown material disposed in said groove and on an upper surface of said layer of first collector material; and
    a layer of second collector material disposed on said regrown material.

15. A transistor as recited in claim 14, comprising:
    a contact formed to each of said base, collector and emitter layers, wherein said contact to said collector layer is disposed on said regrown material on said upper surface of said layer of first collector material.

16. A transistor as recited in claim 1, wherein a difference between a bandgap of said base layer and a bandgap of said region of reduced bandgap energy is selected to provide a desired increase in minority carrier concentration in said region of reduced bandgap energy.

17. A transistor as recited in claim 1, wherein said region of reduced bandgap energy is disposed adjacent to said emitter layer.

* * * * *